United States Patent [19]

Hyduke

[11] Patent Number: 5,051,938
[45] Date of Patent: Sep. 24, 1991

[54] SIMULATION OF SELECTED LOGIC CIRCUIT DESIGNS

[76] Inventor: Stanley M. Hyduke, 3525 Old Conejo Rd., Ste. #111, Newbury Park, Calif. 91320

[21] Appl. No.: 370,896

[22] Filed: Jun. 23, 1989

[51] Int. Cl.5 .................. G06G 7/48; G06F 11/00
[52] U.S. Cl. ......................... 364/578; 364/900; 364/916.3; 364/580; 364/488; 371/23
[58] Field of Search ............. 364/578, 488-490, 364/550, 551.01, 580, 200, 900; 371/15.1, 16.5, 22.1, 22.2, 22.4, 22.6, 23, 25.1

[56] References Cited

U.S. PATENT DOCUMENTS

| | | | |
|---|---|---|---|
| 3,961,250 | 6/1976 | Snethen | 371/23 X |
| 4,587,625 | 5/1986 | Marino, Jr. et al. | 364/578 |
| 4,744,084 | 5/1988 | Beck et al. | 371/23 |
| 4,782,440 | 11/1988 | Nomizu et al. | 364/578 |
| 4,791,593 | 12/1988 | Hennion | 364/578 |
| 4,802,165 | 1/1989 | Ream | 371/19 |
| 4,817,093 | 3/1989 | Jacobs et al. | 371/22.4 X |
| 4,827,427 | 5/1989 | Hyduke | 364/578 X |
| 4,882,690 | 11/1989 | Shinsha et al. | 364/489 X |
| 4,891,773 | 1/1990 | Ooe et al. | 364/490 X |
| 4,896,272 | 1/1990 | Kurosawa | 364/488 X |
| 4,939,681 | 7/1990 | Yokomizo et al. | 364/488 X |
| 4,967,386 | 10/1990 | Maeda et al. | 364/578 |

OTHER PUBLICATIONS

Darringer, J. A., "A New Look at Logic Synthesis", 17th D.A. Conference 1980, pp. 543–549.
Nash et al., "A Front End Graphic Interface to the First Silicon Complier" European Conference on Electronic Design Automation, 26–30 Mar. 1984, pp. 120–125.
de Geus et al., "A Rule-Based System for Optimizing Combinational Logic", IEEE Design and Test, Aug. 1985, pp. 22–32.

Primary Examiner—Joseph L. Dixon
Attorney, Agent, or Firm—David O'Reilly

[57] ABSTRACT

A system and method for selectively simulating logic circuit designs in which a data tables generator receives information from a schematic entry program or netlist entry file and produces data tables for use by a simulator. A designer provides inputs to the data tables generator from a schematic entry program or a netlist entry file. The data tables generator generates from the information received a table of used integrated circuits and a table of their connections. A simulator then receives the output from the data tables generator and produces a design simulation program table that executes integrated circuit model subroutine stored in an integrated circuit model reference library and netlist subroutines stored in a netlist connectivity table. The system may also be used for testing logic circuits on a printed circuit board by capturing signals from a potentially defective logic section of the printed circuit board and feeding them into test points of the integrated circuit simulated by the computer simulator.

17 Claims, 5 Drawing Sheets

SIMULATION OF SELECTED LOGIC CIRCUIT DESIGNS

FIELD OF THE INVENTION

The present invention relates to high speed simulation of logic circuit designs, such as an application specific integrated circuit (ASIC) and printed circuit boards (PCB) and also relates to high speed testing of electronic printed circuit boards.

BACKGROUND OF THE INVENTION

The art of computer simulation or verification of electrical designs is well established. A computer model of a logic circuit design is created based on integrated circuit (IC) models and their interconnections. This logic circuit design model is then stimulated with signals emulating signals applied to a real printed circuit board, built according to the aforementioned electrical design.

Because of high processing speed requirement, the computer aided engineering (CAE) software that simulates electrical designs is usually operating on engineering workstations such as SUN or Apollo. However, even these high power and expensive workstations cannot efficiently handle designs in excess of 40,000 to 50,000 gates or cells. Since today's gate array technologies allow for manufacturing of an IC having in excess of 100,000 cells and printed circuit boards having in excess of 200,000 gates, a new method of efficient electrical design simulation is needed.

The major problem with present simulators is their incompatiblity with the design process. Every design is developed in sections or small design increments. If there is any design problem then designer is locating and reviewing only the design problem area. Unfortunately, the present logic simulators simulate electrical logic designs in their entirely and they cannot by their design exclusively simulate a selected design section. Even if designer is currently working on a small design section, the designer must simulate the entire design which consumes a lot of computer time.

In the last few years the electrical logic designs, such as gate arrays, have became so complex that to have control over the design performance, each design section has to be simulated as it is being developed. Since all present electrical simulators simulate the entire design, they operate slowly and are difficult to use. The present invention solves the simulation bottleneck by allowing simulation of selective logic design sections. Moreover, these logic design sections can be selected and simulated instantly, without any visible loss of time on compilations.

The present simulators compile designs in a batch mode. This means that every, even minute, design change, has to be compiled together with the entire design for tens of minutes before the designer can simulate the design change. None of the batch compilers is capable of compiling exclusively design changes.

The signals that stimulate electrical logic designs are called test vectors. To exercise a design properly, the designer must very often modify the test vectors to find all combinations of input and output conditions that are needed for complete design validation. Unfortunately, such test vectors changes are cumbersome and time consuming with present simulators because each test vector change is subject to lengthy batch compilation together with the entire design.

The printed circuit boards have became so complex that testing them requires a lot of specialized test equipment and trained personnel to manage the sophisticated test equipment. The use of simulation tools for printed circuit board testing has not been very succesful because these simulators simulate the entire board design and therefore they are unduly slow in operation.

It is therefore one object of this invention to provide a new system and method for high speed simulation of electrical logic designs by allowing selective simulation of design sections.

Another objective of this invention is to provide an electrical simulation environment based on an incremental compiler that instantly registers all design changes and eliminates a need for lengthy batch compilations of the design changes. It is also an object of the present invention to eliminate lengthy compilations of test vector modifications by using a new incremental compiler.

Still another objective of this invention is to provide a low cost and high speed system and method for testing of selective printed circuit board sections.

BRIEF DESCRIPTION OF THE INVENTION

The purpose of the present invention is to lower the cost of electrical design development by cutting the simulation time. The present invention also increases design reliability by allowing a designer to fine tune each design section. The tools and techniques described hereinafter are applicable for high speed simulation of electrical logic designs, including gate arrays and printed circuit boards. These tools may be used in conjunction with low cost logic analyzers for testing and troubleshooting of printed circuit boards.

While logic simulators such as CADAT from Daisy Systems Corporation, HILO from GenRad Inc. and others compile and simulate the entire design, the simulator of the present invention simulates only the design sections that have been explicitly selected for simulation by the designer.

The system and method of the present invention applies both to gate arrays that use electronic logic cells and printed circuit boards that use IC chips. For simplicity, IC chips will be referred to hereinafter. However, it shall be understood that the same process, rule and action applies equally to gate array cells.

A simulator according to the invention is based on two dynamically generated tables; a table of used IC chips and a table of their connections. These tables are generated automatically by an incremental compiler, being a part of the simulator, during design entry. Each IC in the IC chip table has several flags. One of the flags indicates that an IC is currently in use by the simulator. As the user adds or deletes ICs from the simulation, the flags of these ICs are modified accordingly. During simulation these flags are checked and all IC chips with a "don't use" flag are skipped over or excluded from the simulation process.

The aforementioned simulator can be used for troubleshooting printed circuit boards. A set of signals can be captured from a failing section of the board, for example with the help of logic analyzer, and fed into corresponding test points and ICs that are simulated by a computer based simulator. Since the ICs that are marked with a "don't use" flag do not participate in the design simulation, the simulator produces test results much faster. Since the system and method of the invention speeds board testing by orders of magnitude, low cost personal computers and logic analyzers can be used for testing of even the most complex printed circuit boards.

The above and other features of this invention will be fully understood from the following detailed description and the accompanying drawings, in which:

DETAILED DESCRIPTION OF THE PREFERRED EMBODIMENT

Figure 5:
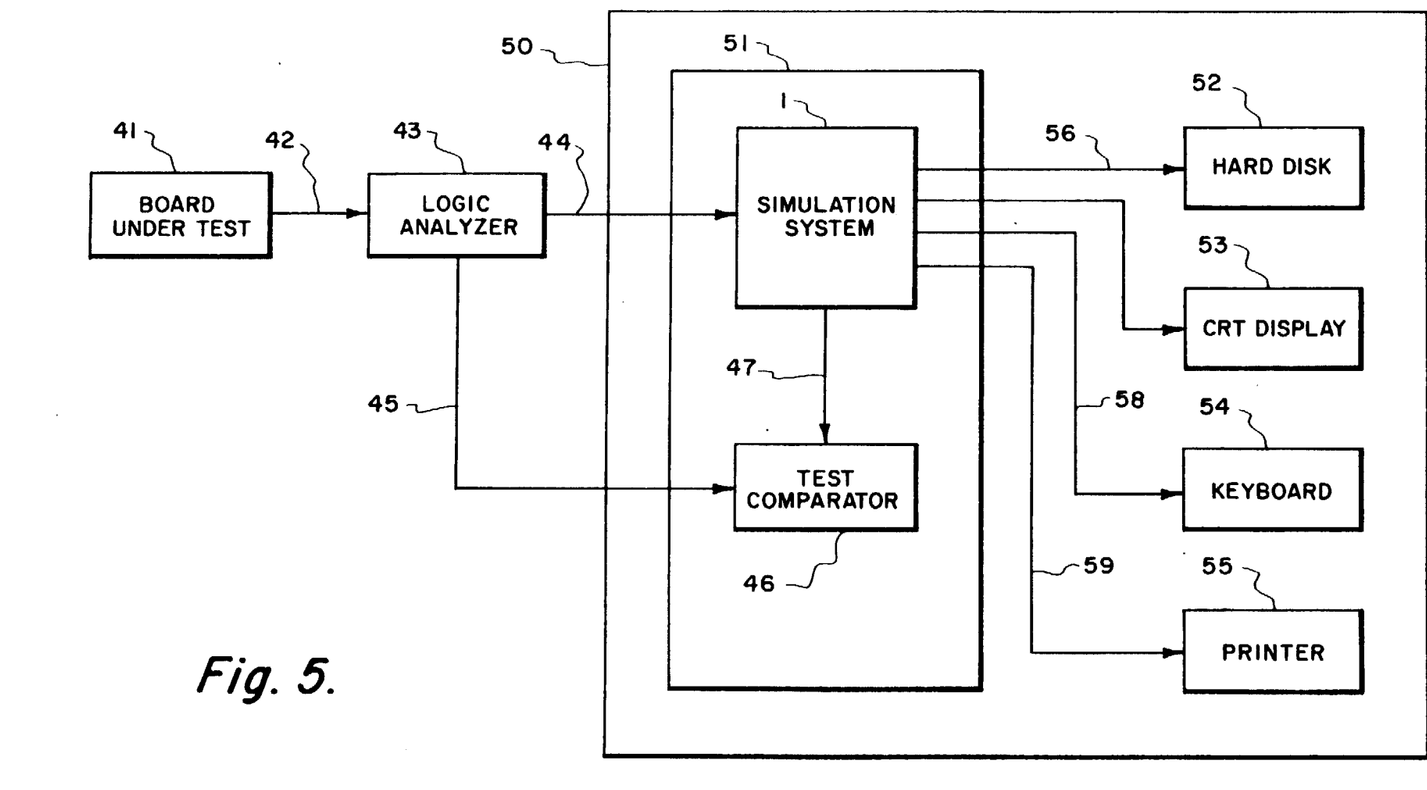
FIG. 5 is a block diagram of a system for printed circuit board testing according to the invention.

Modeling of electronic logic circuits in software is called simulation. The simulator should show all characteristics of the real circuit such as functional and timing behavior. The present invention provides for accelerated simulation of logic circuit designs and printed circuit board testing. General hardware implementation of the invention is shown in FIG. 5. Computing means 50 is similar to the well-known personal computers such as the IBM AT or Sun workstations and include central processing unit 51 having associated RAM memory, hard disk memory 52, data display 53, keyboard 54 and printer 55. Such computers are so well-known to those skilled in the art that no detailed description of their construction or operation is needed here.

Figure 1:
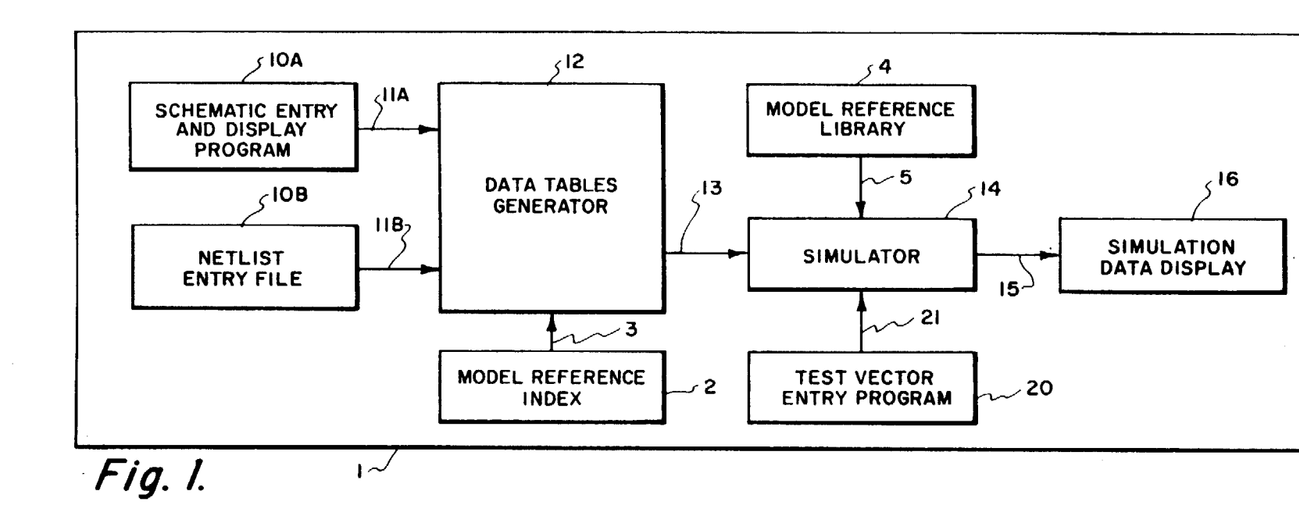
FIG. 1 is a block diagram of simulator according to the invention.
Figure 2:
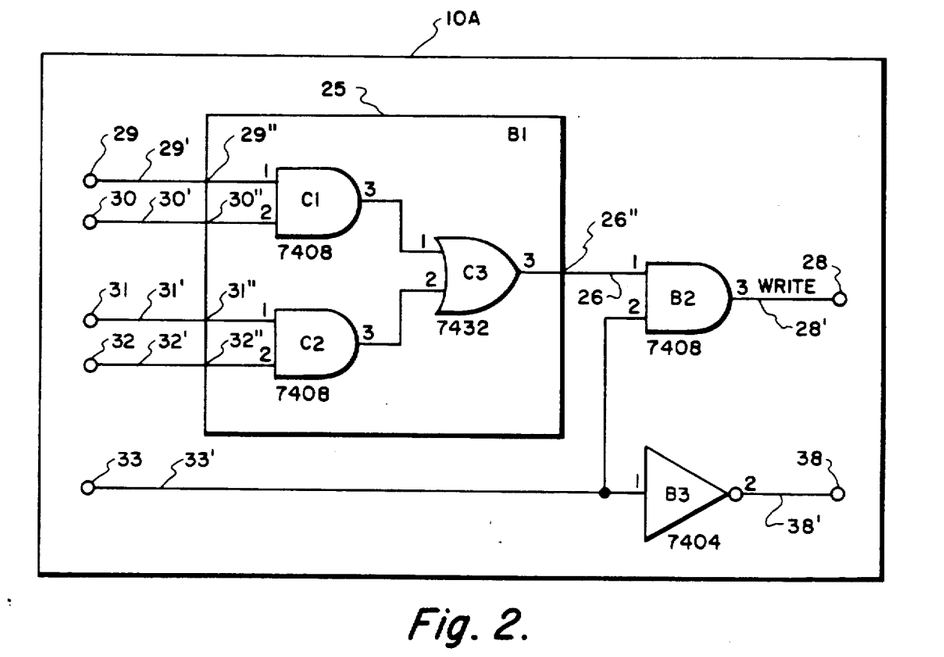
FIG. 2 is a schematic of a typical logic circuit in RAM memory.

FIG. 1 illustrates a block diagram of a simulator according to the present invention. Schematic entry program 10a is used by a designer for logic circuit design entry in the form of schematics. An example of such a schematic is shown in FIG. 2. Netlists also contain all information about system behavior that is needed for simulation, which means an alternative to schematic entry program 10a may be a netlist data file 10b.

Data tables generator 12 is a programmed routine that converts design data presented on input 11a or 11b from schematic entry program 10a and netlist entry file 10b respectively and creates a design elements data table of design elements that include ICs, terminals, switches, signal names and the like. Such a table for the logic design circuit of FIG. 2 is shown in Table 1A. Hereinafter the term IC model will be used as representative for all design elements that have models. Data table generator 12 checks each item in schematic data presented on signal line 11a or from the netlist data fed on signal line 11b, against a list of available IC models, stored in model reference index 2 which may be a program directory in model reference library 4. Data from Model Index Table 2 are fed via signal line 3 into data tables generator 12, and provides the address of a model software subroutine stored in IC models reference library 4.

Data tables generator 12 compares data on signal lines 11a or 11b with a list of IC models in model reference index 2 and generates and stores their locations in RAM memory in Table 1A. If a design element on signal line 11a or 11b does not have a model in models reference index 2, then its model pointer column is set to "none" and this element is not simulated directly. If the design element is a terminal or signal line name, its identity is marked in the appropriate column as shown in the design elements data Table 1A. The "used" or active design elements column in the table marks for reference which design elements should participate in a design simulation. This column, as described later, can be instantly and directly modified by a designer through an entry from both the schematic entry program 10A or netlist entry program 10b entry.

TABLE 1A

| DESIGN ELEMENTS DATA | | | | |
|---|---|---|---|---|
| ITEM | MODEL POINTER | TERMINAL | SIGNAL | USED |
| B2 | 2F8 | NO | NO | YES |
| B3 | 2F4 | NO | NO | YES |
| B1 | none | NO | NO | YES |
| C1 | 2F8 | NO | NO | YES |
| C2 | 2F8 | NO | NO | YES |
| C3 | 2FC | NO | NO | YES |
| end of B1 macro | | | | |
| 29 | none | YES | NO | YES |
| 30 | none | YES | NO | YES |
| 31 | none | YES | NO | YES |
| 32 | none | YES | NO | YES |
| 33 | none | YES | NO | YES |
| WRITE | none | NO | YES | YES |
| end of A1 macro | | | | |

Data tables generator 12 also indicates in Table 1A the end of a set of commands or instructions called a macro such as A1 and B1. The use of this information will be explained in greater detail hereinafter with reference to Table 3. In addition to Design Elements Data Table 1A that includes the list of simulated elements, data tables generator 12 also creates from data on signal lines 11a or 11b a list of all connections between simulated elements. An example of such connectivity data for block B1 is shown in Table 1B wherein RAM pointer A3CO indicates the location of the B1 macro connectivity list in the RAM memory.

TABLE 1B

| NETLIST CONNECTIVITY DATA | | |
|---|---|---|
| MACRO | POINTER | CONNECTIVITY |
| B1 | A3CO | 29", C1/1 |
| | | 30", C1/2 |
| | | C1/3, C3/1 |
| | | 31", C2/1 |
| | | 32", C2/2 |
| | | C2/3, C3/2 |
| | | C3/3, 26" |

All executable IC models or software subroutines are stored in the IC model reference library 4. During creation of Table 1A only pointers to IC models in models reference library 4 are needed. These pointers are provided by Models Index Table 2, stored in models reference index 2.

TABLE 2

MODELS INDEX

| IC MODEL | RAM POINTER |
| --- | --- |
| 7400 | 2F0 |
| 7404 | 2F4 |
| 7408 | 2F8 |
| 7432 | 2FC |

Figure 3:
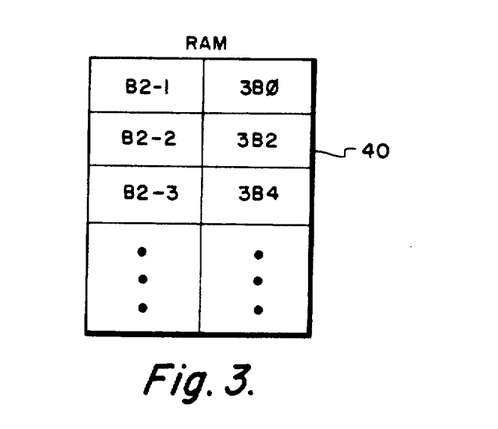
FIG. 3 is an example of memory location assignment in memory.

Every terminal, signal line and every IC pin has an automatically preassigned RAM location. This preassignment is done by simulator 14 as it reads in data from Design Elements Data Table 1A data and reviews the RAM requirement of each model that is referenced by a RAM POINTER in Model Index Table 2. An example of such RAM location assignment is shown in the memory diagram of FIG. 3, where RAM location address 3B0 stores the logical signal value on the input pin 1 of logic gate B2. Similarily, RAM locations 3B2 and 3B4 store logic signal values of pins 2 and 3 of logic gate B2, respectively.

Every time a software call is made to an IC model subroutine in models reference library 4, a subroutine calculates IC model behavior and returns new behavioral data to a RAM location or address. As a subroutine for IC model 7408 in Models Reference Index 2 is called, it fetches its inputs from RAM locations 3B0 and 3B2 and returns the calculated logic value at RAM location 3B4. This process is performed for each IC that is used in the schematic and listed in Table 1A. To execute all IC models and transfer the results to the receiving ICs, a special Table 3 is created under control of simulator 14. The art of IC modeling is well established and many companies, such as ALDEC Company, 3525 Old Conejo Road, Newbury Park, Calif. provide large IC model libraries. Therefore, there is no need to describe in detail the IC model structures but only their use.

The simulator 14 receives Table 1A and 1B data from Data Tables Generator 12 on signal line 13 and automatically creates Design Simulation Program Table 3 that includes a set of excutable subroutines for IC models and netlists as will be described in greater detail hereinafter. The executable subroutines for ICs are addressed by Table 1A and provided by IC models library 4 via signal lines 5. The executable subroutines for netlist data transfers are provided by Table 1B.

Design Simulation Program Table 3 is directly created from Tables 1A and 1B and is a complete design simulation program that executes IC model subroutines stored in IC models reference library 4 and netlist subroutines stored in Netlist Connectivity Data Table 1B. The IC models are executed first. When all IC models, within schematic block 25 (B1) shown in FIG. 2, are executed, a subroutine for transfer of data within the schematic block 25 is called and executed. In this way, by executing the programs in Design Simulation Program Table 3, simulator 14 performs one simulation cycle.

TABLE 3

DESIGN SIMULATION PROGRAM LIST OF EXECUTABLE SUBROUTINES

| | |
| --- | --- |
| set B2 pointer | |
| call B2 model | |
| set B3 pointer | |
| call B3 model | |
| skip B1 | ; it does not have a ready-made model |
| set C1 pointer | |

TABLE 3-continued

DESIGN SIMULATION PROGRAM LIST OF EXECUTABLE SUBROUTINES

| | |
| --- | --- |
| call C1 model | |
| set C2 pointer | |
| call C2 model | |
| set C3 pointer | |
| call C3 model | ; this was the last IC in B1 macro |
| set B1 netlist pointer | ; e.g. A3CO from Table 1B |
| call B1 netlist | |
| ; the above operation executed B1 netlist transfers | |
| set A1 netlist pointer | ; execute A1 netlist transfers |
| call A1 netlist | |
| ; one simulation cycle of schematic in FIG. 2 is completed | |

The schematic entry program 10A and netlist entry file 10B include provisions for marking ICs that should be simulated. Selecting design elements for simulation is well within the scope of established software procedures known in the art, such as LINK and SLAV from ALDEC Company, referred to hereinabove, incorporated hereinby reference, and therefore, need not be described in great detail. When data tables generator 12 creates Design Elements Table 1A, it specifies in the "used" column whether the given design element should be simulated or not. Similarily, when simulator 14 creates the executable Design Simulation Program Table 3, it checks the USED field in Design Elements Data Table 1A. If this field indicates that an element such as IC is not used, then simulator 14 does not include it in Design Simulation Program Table 3 and subsequently that IC is not simulated.

Figure 6:
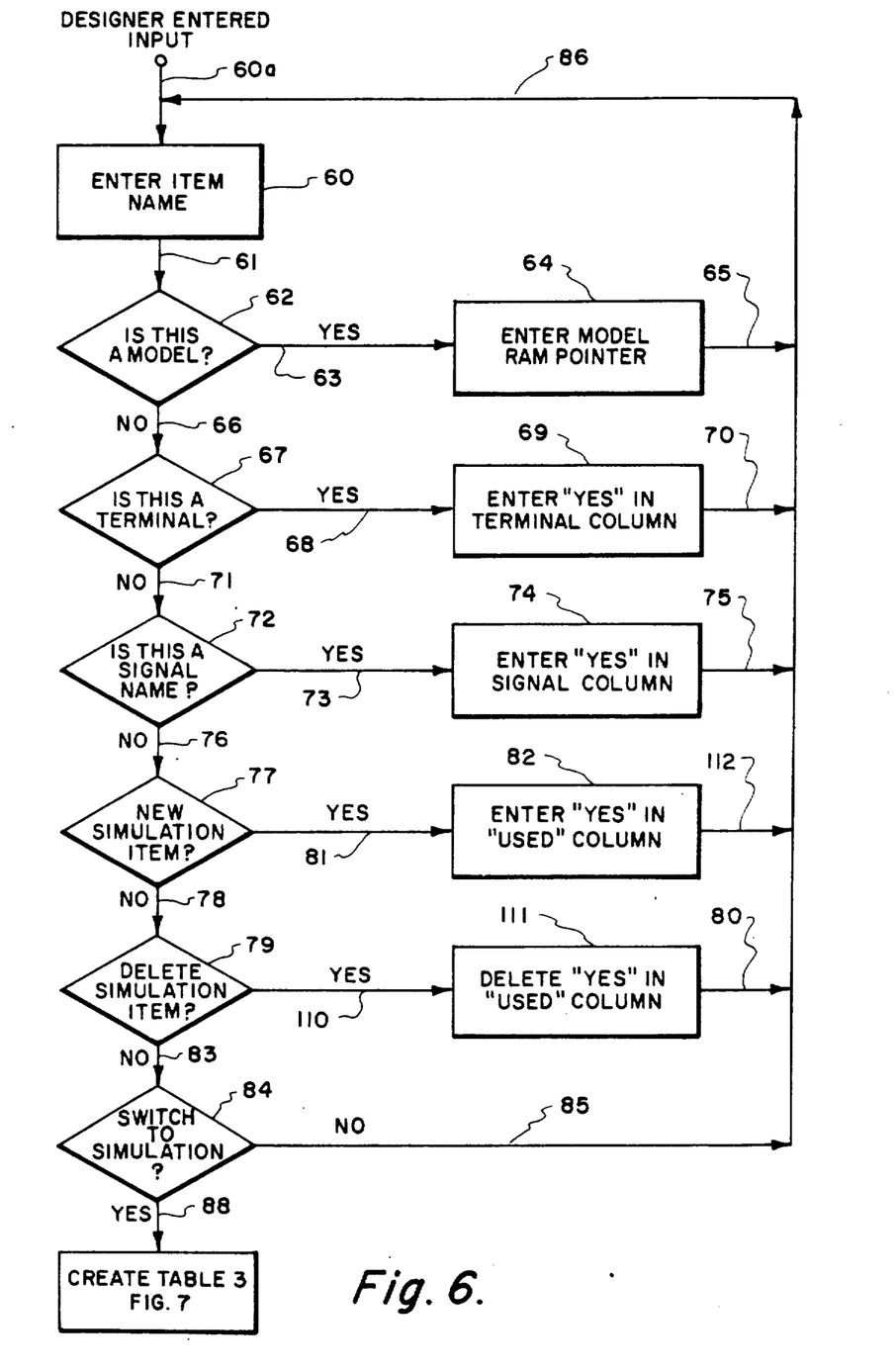
FIG. 6 is a flowchart illustrating a software program of the data tables generator for producing data tables.
Figure 7:
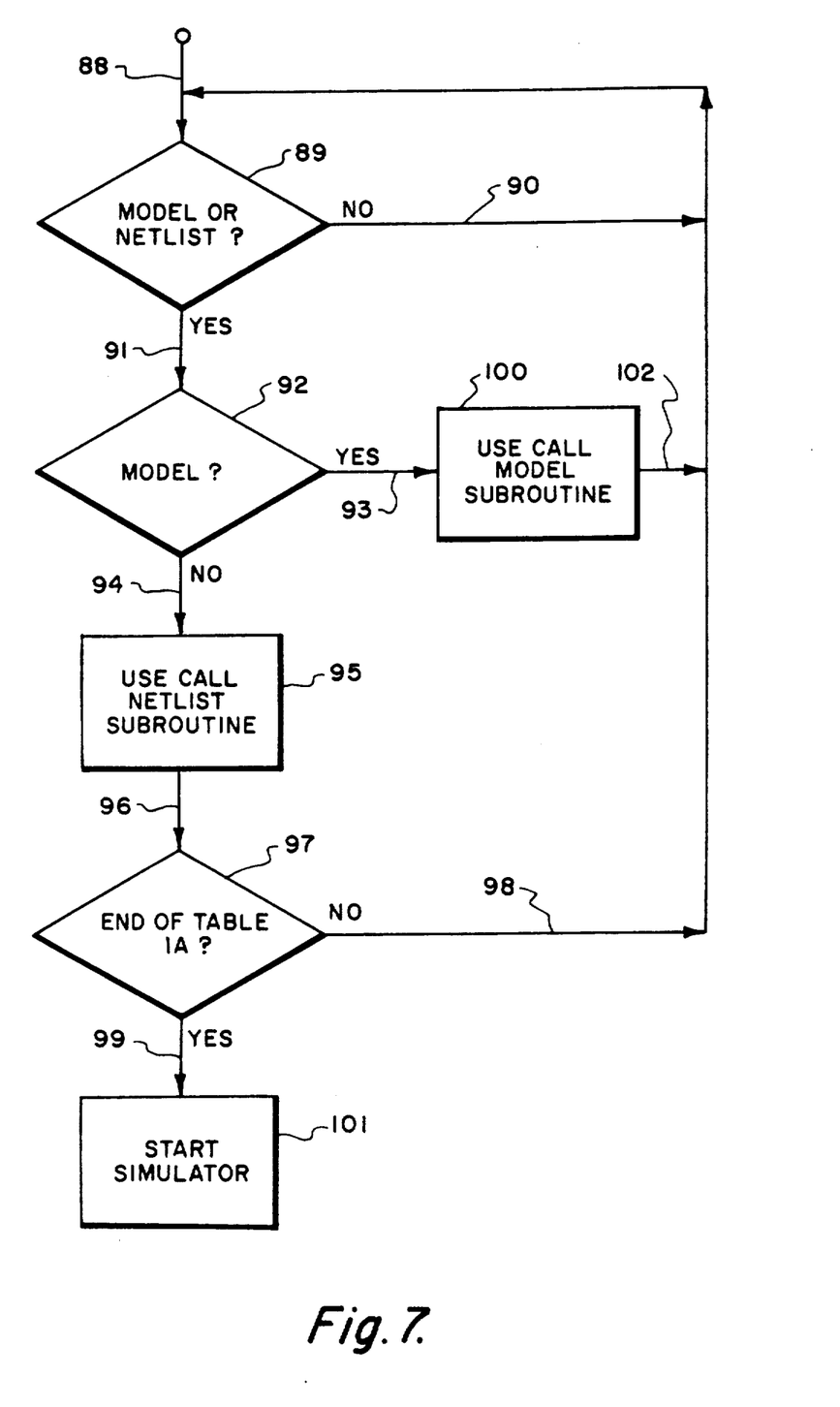
FIG. 7 is a flowchart of a software program for producing an executable design simulation program table.

The program routines for generating elements data tables and design simulation table are shown in FIGS. 6 and 7. The data tables generator 12 is a program that scans the data on signal lines 11a or 11b and produces a table preferably similar to Table 1A. A detailed flowchart diagram of the data tables generator 12 is shown in FIG. 6. Subroutine 60 checks if the designer's input on line 60a is a design element, in which case subroutine 60 enters the design element name into Table 1A. For example, it may be entered in column 1 of Table 1A. Subroutine 62 is triggered by an input on line 61 and checks by means of models reference index 2, (FIG. 1) if the entered input 60a has a model in the model reference library 4. If a model is available, then location of that model in RAM memory is entered into the column "model RAM pointer", of Table 1A. Input on line 60a also comes from program feedback or return line 86 to check for new input on signal line 11a or 11b.

The software subroutine 67 triggered by a signal on line 66 checks if the input is a terminal. This information is derived directly from a netlist or schematic symbol that is associated with the input. If the input is a terminal, it is entered into the Table 1A by subroutine 69. Otherwise, subroutine 72 checks whether it is a signal name. If the input is a signal name, then it is entered in the SIGNAL column of Table 1A and control is returned to the beginning of the program as illustrated in the flowchart of FIG. 6 by signal lines 75 and 86.

If input signal 60a is a request to add an existing design element to the simulation then the associated USED column of Table 1A is marked "YES" by subroutine 82. Subroutine 79 checks whether a design element should be removed from the simulation. If the input on line 60a is a simulation delete command then program subroutine 79 via subroutine deletes the "YES" in the USED column of the selected design elements. If subroutine 84 detects that the designer entered input 60a is a request to switch to simulation mode of operation then the program creating Table 3 is activated via signal line 88. Otherwise, the program returns to the beginning of the flowchart in FIG. 6 to await input.

It should be clear to those skilled in the use of computer aided design how a netlist similar to Table 1B is generated. Such netlists are generated by a number of different companies such as ALDEC Company and Personal CAD Systems.

The simulator 14 is comprised of two programs; one that creates design simulation program table and another that executes the subroutines in the Table 3. The executing program portion of the simulator 14 may be provided by any of the known simulator programs such as SUSIE available from ALDEC of Newbury Park, Calif. The program for creating Table 3 will be described hereinafter with reference to FIG. 7.

The process of generating Table 3 is described with reference to the program flowchart of FIG. 7. Subroutine 89 checks whether the input on signal line 88 from the data tables generating program is either a netlist or an element having a model in model reference library 4. If the input on signal line 88 is neither a netlist nor an element having a model, then no action is taken and the next item 88 in Table 1A is processed. Subroutine 92 checks whether item 88 has an IC model. If it has an IC model then subroutine 100 automatically creates a call to the model library. If the input item 88 has no model then it must be a netlist and subroutine 95 writes a call to the netlist subroutine shown in Table 2. Subroutine 97 checks whether there is an end to Table 1A. If an end is found, subroutine 101 returns control to the simulator 14 which will execute the newly created Table 3. Otherwise, control is returned to the beginning of the flowchart in FIG. 7.

The program routines illustrated flowcharts in FIGS. 6 and 7 are given by way of example only and provide a clear understanding of how Table 3 may be automatically generated by software routines.

Each time a new element is selected by a designer for simulation or deleted from simulation, a new Design Simulation Program Table 3 is generated by simulator 14. Since the executable Design Simulation Program Table 3 is generated through a simple translation of Design Elements Data Table 1A, and Netlist Connectivity Data 1B and Models Index Table 2, Design Simulation Program Table 3 is generated within milliseconds and is instantly available to the user. As a result of this process, a user can instantly select any set of ICs and signals for simulation. Since Design Simulation Program Table 3 automatically includes only the ICs that participate in simulation, this provides a major saving of simulation time. Simulator 14 can be similar to a simulator manufactured by ALDEC known as SUSIE or similar to DIGITAL DESIGN LABS simulator available from Personal CAD Systems.

Figure 4A:
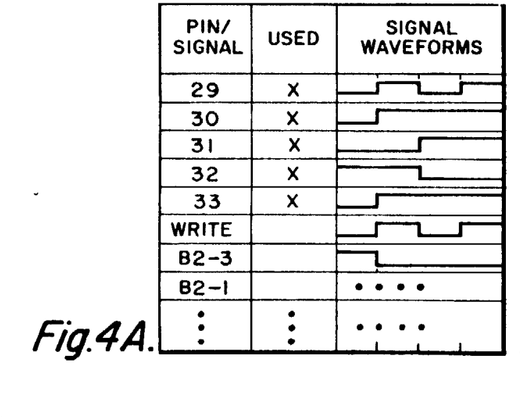
FIG. 4A is an example of a test vector display of possible waveforms for selection.
Figure 4B:
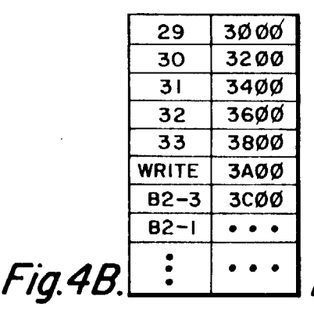
FIG. 4B is a diagram of a pointer table to test vectors.
Figure 4C:
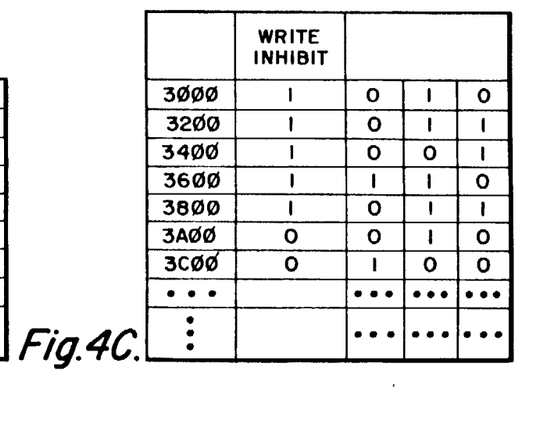
FIG. 4C is an illustration of a portion of a test vector table.

To simulate a design, the user must feed in design stimuli for execution by the executing program in the simulator 14. In an interactive system, the stimuli can be fed directly from a timing display screen. Test vector entry program 20 feeds on signal line 21 information provided as shown by FIGS. 4A, 4B and 4C. FIG. 4A shows graphically the signals that are used in simulation of logic schematic in FIG. 2. Test vector entry program is a test vector editor readily available from sources such as ALDEC and others. The signals created by test vector entry program 20 and by simulator 14 may be selectively displayed on simulation data display 16 (i.e. windowing). All signals shown in FIG. 4A that are used as design stimuli, are marked in the second column with an asterisk (*) and are automatically included in Design Elements Data Table 1A. The logical states of these signals are stored in RAM memory. The pointers to these locations are shown in FIG. 4B. The actual RAM locations for these test vectors are listed in FIG. 4C.

All test vectors that have been marked by a designer in FIG. 4A with an "*" are write protected. Such signals cannot be overriden by simulation data generated by simulator 14. For example, if an "*" is placed next to the "write" signal in FIG. 4A, then the data produced on B2-3 output may not be stored at the "write" signal location.

Instead the old "write" signal data will be retained. Similarily, if pin 3 of gate B2 is displayed in FIG. 4A and marked with the "*", then its corresponding location in RAM memory, shown in FIG. 4C, will be write protected and simulation results will not be saved at the 3C000 RAM location. This process of RAM protection is useful when a designer wants to override simulation results by feeding into an IC model pin his own test vector. Any test vector that has been drawn or entered into FIG. 4A and marked with the "*" will not be altered by the simulation results. Instead, the test vector data stored in FIG. 4C will be used as inputs to simulator 14.

FIG. 5 shows logic analyzer 43, such as Tektronics 1241, receiving signals 42 from a printed circuit board under test 41. Signals 42 are converted into the appropriate signal format, for example the well known IEEE-488 standard, and fed into simulator system in place of test vector entry 20 (FIG. 1). Signal line 42 of logic analyzer 43 can be attached to any section of a printed circuit board 41. If the signal lines 42 are attached to printed circuit board pins corresponding to terminals 29, 30, 31 and 32 as shown in the schematic of FIG. 2 and fed into corresponding test points of schematic block B1 in FIG. 2, then the schematic block B1 can be simulated under the control of signals 44 provided by logic analyzer 43. Test comparator 46 receives pin 3 of gate C3 output from simulator system on signal line 47 and compares it with a corresponding signal on the PC board 41 as provided on signal line 45 by logic analyzer 43. Should there be any discrepancy between signals 45 and 47, the test comparator 46 will show it as a PC board 41 failure. Simulator system 1 output is stored on hard disk 52 and may be displayed on CRT display 16 (FIG. 1) or hardcopy provided on a printer 55.

If a designer selects via schematic entry program 10A that only schematic block B1 should be simulated, then the new Design Simulation Program Table 3 that is generated by simulator 14 will include only block B1 and other model elements will be removed from the Table 3. Since simulation of schematic block B1 is faster then simulation of the entire schematic logic diagram of FIG. 2, the results will be produced much faster by simulator 14.

To ease the transistion between design and simulation data for the designer, it is advantageous to be able to selectively switch the display an a CRT screen between the schematic in FIG. 2 and the simulation data in FIG. 4C. To accomplish this, schematic entry and display program 10A provides for selectively viewing schematic entry and simulation data display 16 on the same hardware display screen shown as CRT display 53 in FIG. 5. The combination of switching between displays on a single screen is called "windowing" and is a known art to those skilled in computer program design, and therefore no detailed explanation is needed here.

This invention is not to be limited by the embodiment shown in the drawings and described in the description which is given by way of example and not of limitation, but only in accordance with the scope of the appended claims.

What is claimed is:

1. A logic circuit design simulation system comprising;
   data table generating means for generating incrementally modifiable design elements table and incrementally modifiable connectivity table;
   logic circuit design entry means for entering logic circuit design data into said data table generating means;
   integrated circuit model input means for entering integrated circuit model data into said data table generating means;
   simulating means including;
      test vector signal entry means for entering test vectors;
      design simulation program generating means for generating an executable design simulation program from said modifiable design elements table, said modifiable connectivity table and selected test vectors entered into said simulating means; and
      executing means for executing said design simulation program;
   whereby one or more selected values in either or both of said modifiable design elements table and said modifiable connectivity table may be incrementally modified with logic circuit design data for quick simulation of a logic circuit design.

2. The system according to claim 1 in which said logic circuit design entry means comprises either schematic data entry means or netlist connectivity data entry means or both.

3. The system according to claim 2 in which said schematic data entry means includes display means for displaying data being entered for selective entry into said data table generating means.

4. The system according to claim 1 wherein said integrated circuit model input means comprises; a model reference library; and a model reference index providing pointers to selected circuit models stored in said model reference library.

5. The system according to claim 1 in which said design elements table includes means for indicating which elements are to be used in a logic design simulation.

6. The system according to claim 5 in which said means for indicating which elements are to be used may be modified by said logic circuit design entry means; whereby a revised design simulating program may be quickly generated.

7. The system according to claim 1 in which said test vector signal entry means includes a logic analyzer; said logic analyzer capturing test signals from a logic circuit for entry into said simulating means.

8. The system according to claim 7 in which said logic analyzer is directly connected to a logic circuit on a printed circuit board for capturing and transferring logic circuit data to said simulation system.

9. The system according to claim 1 including test vector editing means for modifying said test vectors before entering said test vectors into said simulating means.

10. A method for simulating selected logic circuit comprising;
    entering logic circuit design data;
    entering integrated circuit model data;
    generating incrementally modifiable design elements table and incrementally modifiable connectivity table from said logic circuit design data and said integrated circuit model data entered;
    simulating operation of said selected logic circuit; said simulation including:
       entering test vector signals into simulating means;
       generating an executable design simulation program from said design elements table, said connectivity table, and said test vectors; and
       executing said executable design simulation program;
    whereby one or more selected values in either or both of said modifiable design elements table and said modifiable connectivity table may be incrementally modified with logic circuit design data for quick simulation of a logic circuit design.

11. The system according to claim 10 in which entering said logic circuit design data comprises; entering either schematic data or netlist connectivity data or both.

12. The system according to claim 11 including displaying said entered data on display means for modification before entry if desired.

13. The system according to claim 10 in which entering integrated circuit model data comprises; entering referencing data to selectively reference integrated circuit models stored in an integrated circuit model reference library.

14. The system according to claim 10 including generating a used or not-used indication for all elements generated in said modifiable design elements table.

15. The system according to claim 14 including modifying said used indication in said design elements table to select or deselect one or more design elements for simulation.

16. The system according to claim 10 in which entering test vector signal data comprises entering data signals captured from a logic circuit by a logic analyzer.

17. The system according to claim 16 including directly connecting said logic circuit analyzer to a selected logic circuit on a printed circuit board for entry and simulation in said simulator.

* * * * *